United States Patent [19]

Chakalis

[11] Patent Number: 5,215,837
[45] Date of Patent: Jun. 1, 1993

[54] DIRECT PIGMENT PHOTOGRAPHIC PRINTING

[76] Inventor: Arthur T. Chakalis, 494 Theori Ave., Gahanna, Ohio 43230

[21] Appl. No.: 860,026

[22] Filed: Mar. 30, 1992

[51] Int. Cl.$^5$ .......................... G03C 1/00; G03C 1/66
[52] U.S. Cl. .................................. 430/14; 430/271; 430/274; 430/289; 430/292; 430/295; 430/935; 430/495; 430/320; 430/17
[58] Field of Search ............. 430/320, 274, 289, 292, 430/271, 295, 935, 495, 14, 17

[56] References Cited

U.S. PATENT DOCUMENTS

| | | | |
|---|---|---|---|
| 3,072,482 | 1/1963 | Beeber et al. | 430/274 |
| 3,172,763 | 3/1965 | Kumins et al. | 430/289 |
| 3,929,481 | 12/1975 | Kubotera et al. | 430/205 |
| 4,584,267 | 4/1986 | Masukawa et al. | 430/619 |

*Primary Examiner*—Charles L. Bowers, Jr.
*Assistant Examiner*—John A. McPherson
*Attorney, Agent, or Firm*—Thomas M. Schmitz

[57] ABSTRACT

A direct pigment photographic printing process and composition based on a two-step coating process comprising a first coating applied to a sealed substrate containing between 2 to 8 and 8 to 2 weight parts of gum arabic to gelatin, and then applying a second top coating containing preferred ratios of gum arabic to gelatin. The process is based on heating the first and second coating compositions sufficiently above about 105° F. prior to application to the substrate to assure homogeneous mixtures of each coating at the time of application.

17 Claims, No Drawings

DIRECT PIGMENT PHOTOGRAPHIC PRINTING

This invention pertains to photographic printing and more particularly to direct pigment photographic printing which is particularly useful for the production of archival or artistic photographic prints.

BACKGROUND OF THE INVENTION

Direct pigment photographic printing is a dichromate based photographic printing process. Literature references to this type of process are somewhat inconsistent with the printing being referred to as Artique printing, Fresson printing, direct carbon printing and in some instances, simply a miscellaneous non-silver printing process. Direct pigment printing historically evolved from both gum printing and carbon printing processes. Neither process has extensive general commercial value today due to the considerable technical advancements in photography printing as well as the inherent labor intensity of both processes. However, gum printing, carbon printing, and direct pigment printing are all commercially practiced by hobbyists and commercial artists due to the ability to create artistic prints which exhibit special beauty and permanence along with the ability to simulate historical and archival prints. Nostalgic or historical prints are sold as prints, framed pictures, post cards, greeting cards, and similar commercially printed items.

Gum printing utilizes a gum arabic solution to which a dichromate or other light sensitive dye is added along with pigment. The coating is typically brush coated on paper, allowed to dry and exposed to actinic light through a standard continuous tone negative. The gum arabic becomes water insoluble in proportion to the intensity of light exposure transmitted through the negative. The print is developed by floating face down in a tray of cool water whereby soluble gum arabic slowly dissolves leaving an image that consists of the undissolved gum arabic and pigment. Only a limited amount of pigment can be added to the gum arabic solution before excess pigment begins to block out the highlights of the image due to pigment falling out of suspension and staining the paper base. Due to the limited amount of pigment that can be utilized in the gum arabic solution, the resulting image lacks overall intensity. To overcome this problem, gum prints are commonly made through repeated printings of the same negative. A typical gum print is made by repeatedly coating, exposing and developing the same negative until sufficient image intensity is achieved to produce a finished print.

Carbon printing utilizes a sheet of paper coated with a layer of pigmented gelatin commonly called carbon tissue. The carbon tissue is sensitized with a dichromate or alternate light sensitive dye, dried, and then exposed to actinic light through a continuous tone negative. The gelatin becomes insoluble in proportion to light exposure. The insolubility is a variable gradient where insolubility decreases from the surface of the gelatin layer downward toward the paper. If the image is developed on the carbon tissue's paper support, the highlights and a portion of the middle tones of the image are lost. To overcome this problem, the carbon tissue can be dipped or wetted in cool water and followed by the gelatin side contacted with another sheet of paper containing a thin surface coating of hardened gelatin to permit transferring of the image to the gelatin surface. The paper having a hardened gelatin layer is called transfer paper. The two sheets of paper are kept in contact for about 20 minutes and then soaked in water for several minutes until the two sheets of paper can be pulled apart. This procedure transfers the image with all of its tones to the second sheet of paper. This second sheet of paper is then developed by pouring warm water over the image surface to remove the soluble gelatin and pigment and thereby leave the final printed image.

Both processes, although laborious as described above, have the ability to produce photographic prints which can be as permanent as artist water color paintings. Both processes can utilize mineral pigments or inorganic colorants of known resistance to fading or color changes. In either procedure, all of the residual light sensitive chemical can be removed from the paper through adequate washing, and the final print amounts to a pigmented layer of either gelatin or gum arabic.

Direct pigment printing is a specific type of carbon printing and generally provides a method of photographic printing which provides an image which is softer looking than standard silver printing. Due to the nature of the direct pigment printing process, the image is composed of ground mineral pigments selected to provide prints that are light resistant and archival in appearance as water color or art paintings which are characteristically stable with passage of time. Ordinarily, ground mineral pigments are preferred since organic dyes are not ordinarily permanent. Direct pigment prints can be made as monochrome (black and white) or in color or in multiple colors through the use of multiple pass printing. Conventional photographic prints, especially color prints, fade and change colors as time passes due to interaction of the print surface with the environment including, for instance, UV light degradation of the organic dyes and other chemicals used in the printing process. A so-called Fresson print named after a Frenchman who popularized direct pigment printing in the late 1800's reportedly is based on a process where pigment mixed with a colloid is spread on a sheet of paper which is sensitized to light by dipping the colloid covered paper in a dichromate salt aqueous solution. When a contact print is made on this paper by actinic light through a negative the light action causes the sensitized colloid to become insoluble to water in proportion to varying degrees according to light exposure and the negative densities. Exposure to light causes the colloid to become insoluble in proportion to the light passed through the negative. Pouring a slurry mixture of water and sawdust over the exposed print dissolves and wears away the more soluble sections or less exposed areas of the negative, thus leaving a pigmented positive print. In essence, development of the print can be achieved by mild abrasion due to the sawdust/water slurry removing pigment by friction. More pigment is removed from less hardened colloid areas (highlights) while less pigment is removed from the more hardened colloid areas (shadows) and unexposed colloid and pigment areas merely wash away. Fresson prints reputably are the most beautiful and the most acclaimed direct pigment prints. Published attempts to produce Fresson prints either do not work or produce poor imitation Fresson prints. A major problem with direct carbon printing processes is that continuous tones are difficult to achieve. Dark tones and middle tones can be obtained but highlight tones in the negatives are not reproduced in the print. Typically, highlight tones are seen as blurred non-definitive grays with no sharp contrasts between grayish background or shadows.

It now has been found that substantially improved direct pigment prints can be obtained in accordance with the process of this invention to produce prints exhibiting sharp continuous tones wherein definitive dark tones and light tones are obtained along with definitive middle tones to produce clear, definitive, continuous tone prints. In accordance with this invention, direct pigment printing paper can be produced from sized paper (size applied to seal fibers in the paper) by applying a first coating containing a heated mixture of gelatin and gum arabic followed by applying a second coating containing a heated mixture of gelatin, gum arabic, and suitable black, white, or colored pigment. Upon exposure to light followed by development processing, a sharp, continuous tone pigment print is produced. It has been found that if both the first coating and the second pigmented coating are based on a combination of gelatin and gum arabic, the resulting prints exhibit excellent continuous tones with definitive middle tones and clear highlights. The process of this invention produces a finished print with one printing in contrast with several printings in the gum process and, further, produces a finished print without the need to transfer the image as in the carbon printing process. None of the prior art processes suggest a combination of gelatin and gum arabic and, in fact, such mixtures are normally incompatible. This discovery was surprising since normally unheated mixtures of gum arabic and gelatin are incompatible.

A mixture of gum arabic and gelatin permit a photographic image to be made directly on a substrate without the need for multiple printings to achieve definitive tonal range as in gum printing and without the need for image transferring as in carbon printing. By applying the coating mixtures in multiple layers with varying gum arabic to gelatin ratios with the image black, white and/or color pigmentation in the top coating, control of the highlight and shadow tones alike can be advantageously achieved. Although colored pigments are added in the top coating, white pigments can be added in intermediate coatings to increase highlight (white) areas in the print. A pigmented mixture of gum arabic and gelatin provides the ability to reproduce a monochrome photographic negative or positive transparency image as a full tonal range photographic printed image without multiple printing or image transfer. The process is particularly useful for producing archival and artistic photographic prints. These and other advantages of this invention will become more apparent by referring to the detailed description and illustrative examples.

SUMMARY OF THE INVENTION

Briefly, the process and composition of this invention pertain to direct pigment photographic printing and are based on the application to a sealed (sized) non-porous substrate of multiple layers of a gum arabic and gelatin mixture coating solution, where each coating layer contains varying gum arabic to gelatin ratios, pigment content and property modifying additives to permit simultaneous control of both the highlight and shadow tones of the final photographic image. The useful multilayer coating of gum arabic and gelatin mixtures comprise heated mixtures of gum arabic and gelatin applied to a substrate where the first coating comprises on a dry weight ratio between 2 and 8 weight parts of gum arabic and between about 8 and 2 weight parts of gelatin. The second coating is similarly based on various preferred ratios of gum arabic and gelatin.

In accordance with the process of this invention, the first coat is applied to the sized paper substrate or non-porous substrate followed by a subsequent second coat containing the image pigmentation. The resulting direct pigment print paper can be exposed to actinic light through a continuous tone negative, then developed by temperature and time controlled developing steps comprising short immersions in temperature controlled water baths for specific times followed by pouring a water slurry of a mild abrasive material, such as wood sawdust, over the surface of the printing material to remove soluble coating and produce a sharp continuous tone print. The method of application can vary the gum arabic to gelatin ratios between the first and second applied layers of the coating mixture to obtain simultaneous control of the highlight and shadow tones in a photographic printed image.

DETAILED DESCRIPTION OF THE INVENTION

The process and composition of this invention is based on utilization of a useful heated mixture of gum arabic and gelatin to provide multiple layer coating treatment of sized paper substrate or non-porous substrate to produce direct pigment printing paper capable of producing full tonal range photographic images without multiple printing or image transfer. The ability to produce a finished print with one printing and without the need for image transfer are major improvements over both gum printing and carbon printing.

Gum arabic is commonly known as gum acacia or gum senegal where useful gums comprise all gums collected from various varieties or species obtained from Acacia trees. Gum arabic is a natural plant exudate characteristically soluble in water up to about 50% by weight. Alternate synthetic gum arabic substitutes have been developed and, although not preferred, can be used as a replacement for natural gum arabic in this process. The rather high solubility of gum arabic in water provides an aqueous solution of flowable viscosity and is distinguished from other natural plant gum exudates which are not readily soluble in water and produce viscous aqueous mixtures at low concentrations. Natural gum arabics ordinarily comprise a neutral or slightly acidic salt of a complex polysaccharide containing calcium, magnesium, and potassium cations. A broad range of molecular weights may range from 260,000 to 1,160,000. Due to the natural variability of gum arabic, particularly gum arabic can have a specific gravity ranging from 1.3 to 1.5 with a typical value of about 1.37. A particularly preferred gum arabic comprises commercially prepared 14 Baume gum arabic solution in water which contains 288 grams per liter dried gum arabic at a specific gravity of 1.372. Commercial dry natural gum arabic can have particle sizes ranging from coarse lumps to fine powders. Due to the time needed to completely dissolve gum arabic into solution, commercially prepared solutions are available. In this invention a commercially prepared 14 Baume solution is very desirable due to ease of handling.

Commercial gelatins typically are classified as food grade, pharmaceutical grade and photographic grade and are also classified by their relative gelling strength as soft, medium or hard. The distinction between food, pharmaceutical and photographic grades predominately relates to the type of extraction process and the ultimate purity requirements. The relative gelling strength of the gelatin predominately relates to the collagen source and the sequence in which the gelatin is extracted. Gelatins characteristically form reversible gels where gelling occurs below about 35° C. but is reversible upon heating. Gelatins ordinarily comprise large complex polypeptide molecules having a typical molecular range of between about 50,000 and 70,000. In this invention any type of gelatin can be utilized as both soft and hard gelatins have proven successful. Commercial gelatins can have particle sizes ranging from coarse particles to fine powder. In this invention, fine powders are preferred in order to facilitate dispersion and subsequent absorption of water.

Although the desired useful ratio of gum arabic to gelatin can vary depending upon the grade of each material, the useful range of gum arabic to gelatin ratio on a dry weight basis ranges from 2:8 to 8:2 in the first (intermediate coating formulation) coating and gum arabic to gelatin ratio from 0:1 and 3:1 in the second (top pigmented coating formulation) coating as demonstrated in the examples. Although the useful ranges can furnish continuous tone images, preferred compositions narrow the gum to gelatin ratio which in turn enhances development processing consistency. Optimal development processing results are achieved within a preferred narrower gum arabic to gelatin ratio range of from 4:6 to 7:3 weight parts in the first coating and from 3:17 and 1:1 weight parts in the second coating. The selection of a specific weight ratio within the useful ratio limits for both the first and second coatings affects the final print's tonal range. In the first coating, raising the gum to gelatin ratio increases the effectiveness of development on the highlight tone areas to effectively expand the overall tonal range while decreasing the ratio provides the opposite effect which reduces the tonal range. In the second coating, lowering the gum to gelatin ratio decreases the effectiveness of development on the shadow tone areas to effectively expand the overall tonal range while increasing the ratio provides the opposite effective which reduces the tonal range. The total concentration of gum arabic and gelatin affects the ultimate viscosity of each formulation and as such is variable depending upon the type of coating application equipment utilized.

As a generalization, the quality of print obtained by this invention depends on the ratio of gum arabic. At high weight ratios of gum arabic to gelatin (3:2), the overall image intensity is decreased where shadow tones are not as dark as desired. The print develops easily but too much pigment is removed from the shadow tone areas during slurry development. At low weight levels of gum arabic to gelatin (2:5), the print will exhibit dark shadow tones and totally unexposed areas of the print can be stained with a light gray tone due to resistance to slurry abrasion during the developing process. Low gum to gelatin ratios also produce undesirable noticeable grain pattern. Although uncertain, it is believed that the gum arabic contributes to the composition adhesive properties while the gelatin contributes to cohesive properties. The printed image is a physical deposit of pigment on the paper surface where light exposed areas cause dichromate to decrease the solubility of the pigmented colloid. Thus, after development, the unexposed areas should have no pigmented colloid layer, the highlight tone areas comprise a thin layer of pigmented colloid, the middle tone areas are somewhat thicker while the shadow tone areas exhibit the thickest layer of pigmented solid. Hence, the ability to adjust the printed highlight and shadow tones by adjusting the gum to gelatin ratio in both the first and second coatings is a surprising major discovery. The first coating characteristics appear to dominate and the second coating does not work without the first coating.

Accordingly, the first coating composition can broadly contain between 2:8 and 8:2 weight parts of gum arabic:gelatin (alternatively stated between 20% and 80% by weight gum arabic in the gum/gelatin mixture). The extreme ratios produce a workable but diminished quality print. A preferred optimal range for high quality prints is between 4:6 and 7:3 gum arabic:gelatin (alternatively stated between 40% and 70% by weight gum arabic in the gum arabic and gelatin mixture). In the second coating layer, the coating composition can broadly contain between 0:1 and 3:1 weight parts of gum arabic:gelatin (alternatively stated between 0% and 75% gum arabic by weight on the gum/gelatin mixture), where extreme ratios produce diminished quality prints. Preferably the second coating contains between 15% and 75% gum arabic based on the mixture while the most preferred range for high quality prints is between 15% and 50% by weight gum arabic in the gum arabic and gelatin mixture.

If the first coating and the second coating are premixed and applied as one single layer, a severe degradation in the printed image's tonal range occurs. At levels of gum arabic to gelatin above about 1:1 and applied as one coat, the overall image intensity is inadequate to properly render shadow tones in the print. At levels of about 1:1 and lower and applied as one coat, the print is stained or fogged as unexposed areas exhibit print densities which block the negative's true highlight detail. Adjustments to a single layer's gum arabic to gelatin mixture do not provide an image with adequate shadow tone intensity and adequate highlight detail. Thus, a two-step coating process to provide two coating layers is required in this invention.

The ability to use a compatible mix of gum arabic with gelatin is surprising inasmuch the two materials are known to be incompatible and to cause a precipitation into a two phase separation. The two materials are in fact identified in literature as being incompatible. See "Handbook of Water-Soluble Gums and Resins" by Robert L. Davidson, Editor, page 8.5, which reports the various effects of additives added to gum arabic solutions and specifically reports that gelatin is incompatible with gum arabic and forms coacervates. Coacervation is the separation of a colloid into two liquid phases which makes the application of the colloid or colloid mixture to a substrate difficult and impossible as a practical matter. Although a mixture of the two materials forms coacervates to a varying degree based upon the total concentration and ratio, it has been found that this effect can be overcome by applying heat to the aqueous solution of gum arabic and gelatin. The otherwise incompatible mixture is heat reversible and becomes visually homogeneous when the temperature of the aqueous mixture exceeds the gellation temperature of the mixture. The net result is that a mixture of gum arabic and gelatin can be coated on a sealed paper substrate while the aqueous solution is maintained heated above its gellation temperature. The gellation temperature can be lowered by adding additive amounts of urea if desired. Once the colloid mixture is heated and reversed from a gel, reversion back to gel when applied to printing paper is time and temperature related. The viscosity begins to increase but reformation back to a gelled state ordinarily takes several minutes if allowed to cool. The heated homogeneous colloid solution is applied to a substrate paper before gellation which allows a thin layer colloid to cool to ambient temperatures rather quickly. The first coating is applied and dried followed by application and drying of the second coating, whereupon the multi-layer coated paper can be utilized for a photographic printing process in accordance with this invention to produce full tonal range photographic images.

The second layer coating composition particularly contains white, black and/or colored pigments. Useful pigments comprise pigments including, for instance, white pigments such as titanium dioxide, zinc oxide, zinc sulfide, lithopone, white lead (carbonate), and lead sulfate; color or tinctorial pigments such as titanium yellow, iron oxides (red, yellow, brown, black), and iron oxide/metallic-oxide, lead chromates, (yellow, red-yellow), lead chromate-lead sulfate, chrome oranges, molybdate orange (orange, red), cadmiums (green, yellow, orange, red), iron blue, ferric ammonium cyanides, manganese cobalt (violet), chrome oxide green; and black pigments principally carbon black. Organic colorants such as phthalocyanine blue or green can be used if desired. Mineral or inorganic pigments are desirable for stability but not necessarily required. Phthalo blue for instance, will provide light fast archival prints. To produce a print from a negative, the top coat contains the type of pigment desired in the print. For instance, brown pigment would produce a print with a brown cast. The white areas or highlight brilliance can be increased by adding some white pigment to the first coating. The procedure would be reversed, however, if producing a positive image from a positive transparency such as a slide. For positive transparencies, the white pigment for highlight emphasis would be contained in the top layer coating while the colored pigment such as brown would be contained in the first coating applied to the sealed substrate.

In accordance with the process of this invention, a compatible aqueous mixture of gum arabic and gelatin is produced by mixing the two components in water at a water temperature sufficient to form a compatible mixture, desirably above about 105° F. and preferably between 120° F. and 140° F. In a preferred procedure, gelatin is first added to ambient or mildly warm water and allowed to stand until all of the gelatin grains have absorbed sufficient water to at least begin to swell the gelatin grains. The absorbed aqueous gelatin mixture is preferably maintained at a temperature between 120° F. and 140° F. while gum arabic is added to produce a compatible heated mixture of gelatin and gum arabic. The compatible mixture is visually homogeneous in appearance. In a less preferred mode, the mixing sequence can be reversed in a similar manner while mixing heated aqueous solutions of each component. The heated compatible aqueous mixture is maintained at temperatures above 105° F., and preferably between 120° F. and 140° F., while adding other additive components including white, black or colored mineral pigments to the heated mixture. Pigments are preferably added last to the heated aqueous mixtures and ordinarily dispersed by high shear mixing such as in a Cowels mixer. The aqueous gelatin/gum arabic mixture is maintained preferably between 120° F. and 140° F. while dispersing the mineral pigment together within the preformed compatible mixture of gelatin and gum arabic.

Once the mixing process of all components is complete, the aqueous mixture can be cooled, if desired, to room temperature and stored until used to produce the direct carbon printing paper in accordance with this invention. Cooling the aqueous mixture causes the aqueous mixture of gelatin and gum arabic to gel or form an incompatible coacervate as previously described but such gel is again reversible upon heating above 105° F. Mixtures cooled to ambient temperatures have indefinite stability for several months and, depending upon the additions, can be stable for up to about a year or more. With stored compositions, the gelled aqueous formulation can be reheated preferably to about 120° F. to 140° F. and held at these temperatures until the gelled mixture has completely reversed from the ambient gelled physical state to a compatible liquid mixture.

In accordance with this invention, a freshly made aqueous mixture of gelatin and gum arabic or a reheated preformed, gelled aqueous mixture of gelatin and gum arabic is applied, preferably spray applied at temperatures above 105° F. and preferably between 120° F. and 140° F. to a sealed (sized) paper substrate. The first coating layer can be applied to presized paper and ordinarily does not contain coloring pigments. Presized paper is commercially available but can be produced from unsized paper having good wet strength by applying a sizing coating comprising an aqueous gelatin coating of gelatin dispersed in water. For instance, artists' water color paper contains a surface finish where the sizing on the paper as supplied by the manufacturer varies depending on paper types and grades. Ordinarily, a minimum of size is required by the manufacturer to bind the cellulose fibers to form the paper. A useful commercial paper is an artists paper Rives BFK. Rives BFK is sized sufficiently for a watercolor artist but ordinarily should have additional sizing added for use in the process of this invention. The intent of sizing the paper or starting with presized paper is to provide a sized paper substrate where the fibers in the paper substrate are sealed to provide a non-porous substrate and prevent undue absorption of subsequently applied coatings into the paper substrate.

In accordance with this invention, a first coating composition comprising the aqueous mixture of gelatin and gum arabic is applied to the presized paper substrate. If the aqueous solution is stored at room temperature as described above, the mixture is first heated above the gellation temperature of the mixture, ordinarily above about 105° F., and preferably between 120° F. and 140° F. before applying the first coating to the presized paper substrate. In this regard, the selected formulation is heated to 130° F. $+/-10°$ F. and held until the mixture has completely reversed to a homogeneous liquid from its ambient temperature gelled condition. A detail type spray gun equipped with a high viscosity needle can be utilized to spray coat layers of the selected coating formulation containing a heated mixture of gum arabic and gelatin onto selected presized paper substrate hung inside a spray booth. Spray application is preferred, although other application methods for solution coating of colloid can be utilized if desired. Each coating layer constitutes a continuous spray application until the surface of the substrate appears wet but should not be applied so heavily as to cause runs to begin to form. Thereafter the coated substrate is then hung up to permit further drying.

The presized paper containing the first layer application of compatible aqueous gelatin/gum arabic mixture is further processed by applying thereto a second top pigment coating layer containing a similarly heated, compatible aqueous mixture of gelatin and gum arabic but particularly including suitable coloring pigments such as black or white or other color pigment. The top pigmented coating is preferably spray applied although other coating application methods can be used. Where the top pigmented coating contains a dichromate light sensitizing agent, this application is done under darkroom safelight conditions. The selected pigmented coating formulation is heated to 130° F. $+/-10°$ F. and held until the mixture has completely reversed from an ambient temperature gelled condition to a compatible liquid mixture. An air brush equipped with a high viscosity needle can be utilized to mist coat the substrate with the second or top pigmented coating. A fairly heavy pigmented top layer is applied but not so heavily as to create a solid colored finish. Coatings which contain carbon black as the pigmentation and properly applied to a substrate should appear dark gray to black under reflected light and gray when viewed by light transmitted through a paper substrate. Once coated, the substrate is then permitted to air dry. The result is direct pigment printing paper.

The direct pigment printing paper can be exposed to light through a continuous tone negative to produce photographic prints. Prints can be made by exposure to actinic light under a full size negative or through a high intensity enlarger. Exposure time will vary with the intensity and spectral content of the light source, the density range of the negative and to some extent the amount of dichromate salt or light sensitive dye present in the coatings. The examples have been produced utilizing an enlarger equipped with a 300 watt halogen light source which requires a 5 to 90 minutes exposure time depending upon the negative's density range and the extent of the enlargement.

The exposed print material can be soaked 60 seconds in a tray of water at 60° to 70° F., and then transferred to a warm soak bath for a time and temperature as identified in the specific examples as the bath temperature can effect the final image's sharp appearance. The print material is then placed on an inclined surface angled at approximately 45 degrees. A water slurry of Poplar sawdust at a temperature of 60° to 70° F. is poured over the face of the paper until the image is developed. The extent of this slurry treatment can vary based upon the warm soaking procedure, the first coating formulation, the second coating formulation, as well as the desired level of development judged on an aesthetic basis. For a $9'' \times 12''$ print as little as 1 pint or as much as 2 gallons of the slurry mixture are required. Following the slurry treatment, the print is washed in water below about 70° F. to remove any residual dichromate and then the print is hung to air dry. Subsequent hardening of the emulsion can be done if desired.

Though the examples all utilize either white or black pigmentation, the selection of a pigment color is only limited by the chance that a specific pigment chemically reacts with a dichromate or alternate light sensitive dye. An extension of this process would be to use procedures for utilizing color separation negatives to sequentially print in the primary colors to create a full color photographic image. If multiple color printing is desired, subsequent sequential print steps will ordinarily utilize the colored pigments desired.

The following examples are intended to demonstrate the various alternate applications of this invention but are not intended to restrict the extent of the discovery to the specific formulations identified. The example formulations include additives which enhance the coating formulations in a conventional manner.

EXAMPLE 1

Direct pigment printing paper was produced in accordance with this invention by (a) first sizing untreated paper substrate, then (b) application of an intermediate (first) coating layer, followed by (c) application of a top pigmented (second) coating layer. The size layer (a), intermediate layer (b), and top layer (c) were all applied by spray application.

a) Size Coating Formulation 350 ml Distilled water
28 gm. Gelatin (soft food grade gelatin)
120 ml. 70% Isopropyl Alcohol The size coating formula components were added in the sequence indicated above. Gelatin was added to water at ambient temperatures and allowed to stand until all the grains absorbed enough water for swelling before heating. The aqueous gelatin mixture was then heated to about 130° F. and maintained at 130° F. $+/-10°$ F. while adding the last component.

b) Intermediate Coating Formulation 279 ml. Distilled water
14 gm. Gelatin (soft food grade gelatin)
68 ml. 14 Baume Gum Arabic
120 ml. 70% Isopropyl Alcohol
9.3 gm. $TiO_2$ White Pigment (Optional)

The intermediate (first layer) coating components were added together in the sequence indicated above. The gelatin was added to the water at room temperature and allowed to stand until all grains absorbed sufficient water to begin to swell before heating. The aqueous gelatin mixture was then heated to about 130° F. and maintained at 130° F. $\pm 10°$ F. while adding the gum arabic and other components. The last component, $TiO_2$ white pigment, was added by pouring the liquid mixture into a kitchen blender and running the blender at the highest speed while slowly sifting the white pigment into the blender. The addition of the $TiO_2$ white pigment was optional though preferred as it provides a brighter white background in the finished print's highlights which enhances the print's ascetics.

c) Top Pigmented Coating Formulation 94 ml. Distilled water
10.6 gm. Gelatin (soft food grade gelatin)
7.5 gm. Glycerin Soap (shavings)
1.25 ml. Corn Syrup
37 ml. 14 Baume Gum Arabic
7.5 ml. 4% Ammonium Hydroxide Solution
102 ml. 70% Isopropyl Alcohol
10 gm. Pigment, carbon black
6.25 gm. Ammonium Dichromate The top pigment (second layer) coating formula was prepared in the same manner as the intermediate coating. Carbon Black Pigment was added by pouring the liquid mixture into a kitchen blender and running the blender at the highest speed while slowly sifting the carbon black pigment into the blender. The Ammonium Dichromate was added last and just prior to the application of this coating to the paper substrate being prepared for printing.

Size coat application: A 11.25"×14.25" sheet of Rives BFK paper was mounted tautly onto a rigid metal frame by taping the outer edge of the paper with masking tape which facilitated handling of the paper substrate during the preparation steps. The size coating formulation (a) was heated to 130° F. +/−10° F. and held until the mixture was completely reversed to a liquid from its gelled condition at room temperature. The size coating formulation (a) was then transferred into a detail spray gun equipped with a high viscosity needle assembly. The spray gun's paint cup was preheated to 130° F. +/−10° F. and maintained at this temperature in between coating layer applications.

Two layers of size coating formulation (a) were sprayed onto the surface of the paper substrate. Each layer constitutes a continuous spray application until the surface of the substrate appears wet but not so much so as to permit runs to begin to form. Should any runs or unevenness in coating application develop, the paper can be placed face up and level inside of a box maintained at 130° F. +/−10° F. for one to three minutes which permits the coating to flow and form a more even coating. Each coating layer application was permitted to air dry before applying the next coating layer.

Intermediate Coat Application: The intermediate coating formulation (b) was heated to 130° F. +/−10° F. and held until the mixture was completely reversed to a liquid from its gelled condition at room temperature. The intermediate coating formulation (b) was then transferred into a detail spray gun equipped with a high viscosity needle assembly. The spray gun's paint cup was preheated to 130° F. +/−10° F. and maintained at this temperature in between coating layer applications.

Two layers of intermediate coating formulations (b) were sprayed onto the surface of the coated paper substrate containing coating (a). Each layer constitutes a continuous spray application until the surface of the substrate appears wet but not so much so as to permit runs to begin to form. Should any runs or unevenness in coating application develop, the paper can be placed face up and level inside of a box maintained at 130° F. +/−10° F. for one to three minutes which permits the coating to flow and form a more even coating. Each coating layer application was permitted to air dry before applying the next coating layer.

Top Pigment Coat Application: The top pigment coating formulation (c) was heated to 130° F. +/−10° F. and held until the mixture was completely reversed to a liquid from its gelled condition at room temperature. The final component of the top pigmented coating formulation (c), ammonium dichromate, was then added under darkroom safelight illumination which was maintained throughout all of the following procedures in this example. The top pigment coating formulation (c) was then transferred into an air brush equipped with a high viscosity needle assembly. The air brush's paint jar was preheated to 130° F. +/−10° F.

One layer of top pigment coating formulation (c) was sprayed onto the surface of the coated paper substrate containing coatings (a) and (b). The spray application was done by mist coating the paper substrate with several passes to provide a fairly heavy coating but not so heavy as to create a solid colored finish. When using carbon black as the pigment, the coated paper appears dark gray to black under reflected light and gray when viewed by light transmitted through a paper substrate. The top pigment coating layer was permitted to air dry which completed the preparation of the direct pigment photographic printing paper.

Exposure of the direct pigment photographic printing paper: The direct pigment photographic printing paper was exposed to actinic light passing through a negative. The 35 mm negative used for these tests was enlarged by utilizing an enlarger equipped with a 300 watt halogen light source which requires 5 to 90 minutes of exposure depending upon the negative's density range and the extent of the enlargement. A 9"×12" enlargement was made with a total exposure time of 64 minutes.

Additional test prints were made enlarging the same test negative to a 4"×5" print size. The 35 mm test negative's shadow areas measured about a 0.30 density. The projected negative's light energy levels falling on the printing paper in the same shadow areas measured about 83 foot lamberts. Several exposures were made with similarly coated paper which provided the following results after the print(s) was developed:

| Exposure Time | Evaluation of the Print's Shadow Tone Area |
|---|---|
| 0 minutes | No visible print density |
| .5 minutes | Very faint highlight print density |
| 1 minute | Highlight print density present |
| 2 minutes | Middle tone print density |
| 4 minutes | Middle to shadow tone print density |
| 8 minutes | Shadow tone print density |
| 16 minutes | Darker shadow tone print density |
| 32 minutes | Darker shadow tone print density |
| 64 minutes | No change in shadow tone density |

Development of the Direct Pigment Photographic Printing Paper:

Development of the print(s) was begun within 1 to 2 minutes after completion of the exposure. The exposed print(s) was placed in an ambient water bath and soaked for 60 seconds at 60° F. to 70° F. Thereafter, the exposed print(s) was then transferred to a warm soak water bath for 60 seconds at 84° F. The exposed print(s) was removed and placed on a plate which was inclined at approximately 45°. A water slurry of Popular sawdust at 60° F. to 70° F. was poured over the face of the paper until the image was developed. About 1 gallon of the aqueous Popular sawdust was used on a 9"×12" print and about 1 quart was used on a 4"×5" print(s). Following slurry treatment, the exposed print(s) was washed in water below 70° F. to remove any residual Ammonium Dichromate and hung to air dry.

When properly exposed, the resulting print exhibits sharp, continuous, definitive dark tones and light tones along with clear definitive middle tones.

EXAMPLE 2

In this example, the gum arabic content in the intermediate (first) coating formulation (b) was minimized while maintaining the same total dry weight gum arabic and gelatin content as compared to Example 1. The ratio of gum arabic to gelatin in the intermediate coating is approximately 2:8.

a) Size Coating Formulation

Identical to Example 1.

b) Intermediate Coating Formulation 274 ml. Distilled Water
22.7 gm. Gelatin (soft food grade gelatin)
20 ml. 14 Baume Gum Arabic 101 ml. 70% Isopropyl Alcohol
7.9 gm. TiO$_2$ White Pigment c) Top Pigmented Coating Formulation Identical to Example 1.

The formula preparation and application procedures were identical to Example 1 with the exception of utilizing the intermediate coating (b) formula shown above.

A 4"×5" enlargement was made with an exposure of 7 minutes utilizing the procedures in Example 1.

Development was conducted as described in Example 1 with the exception of the warm soak step being modified to 45 seconds at 90° F. and a significant increase from about 1 quart to over 2 gallons of sawdust slurry needed to achieve development.

The finished print provided a full tonal range image though the entire tonal range was less intense rendering the overall print image lighter than Example 1.

EXAMPLE 3

In this example, the gum arabic content in the intermediate (first) coating formulation (b) was maximized while maintaining the same total dry weight gum arabic and gelatin content as compared to Example 1. The ratio of gum arabic to gelatin in the intermediate coating is approximately 8:2.

a) Size Coating Formulation

Identical to Example 1.

b) Intermediate Coating Formulation 236 ml. Distilled Water
6.3 gm. Gelatin (soft food grade gelatin)
86 ml. 14 Baume Gum Arabic
111 ml. 70% Isopropyl Alcohol
8.7 gm. TiO$_2$ White Pigment c) Top Pigmented Coating Formulation Identical to Example 1.

The formula preparation and application procedures were identical to Example 1 with the exception of utilizing the intermediate coating (b) formula shown above.

A 4"×5" enlargement was made with an exposure of 7 minutes utilizing the procedures in Example 1.

Development was conducted as described in Example 1 with the exception of the warm soak step being modified to 60 seconds at 80° F. and a decrease from about 1 quart to about 1 pint of sawdust slurry needed to achieve development.

The finished print provided a full tonal range image though the entire tonal range was rendered significantly darker than in Example 1. Additionally, the image exhibited a pronounced increase in grain pattern.

EXAMPLE 4

In this example, the gum arabic content in the top pigmented (second) coating formulation (c) was minimized while maintaining the same total dry weight gum arabic and gelatin content as compared to Example 1. The ratio of gum arabic to gelatin in the top pigmented coating is 0:1.

a) Size Coating Formulation

Identical to Example 1.

b) Intermediate Coating Formulation

Identical to Example 1.

c) Top Pigmented Coating Formulation 131 ml. Distilled Water
21.3 gm. Gelatin (soft food grade gelatin)
7.5 gm. Glycerin Soap (shavings)
1.25 ml. Corn Syrup
0 ml. 14 Baume Gum Arabic
7.5 ml. 4% Ammonium Hydroxide Solution
102 ml 70% Isopropyl Alcohol
10 gm. Pigment, Carbon Black
6.25 gm. Ammonium Dichromate The formula preparation and application procedures were identical to Example 1 with the exception of utilizing the top pigmented coating (c) formula shown above.

A 4"×5" enlargement was made with an exposure of 7 minutes utilizing the procedures in Example 1.

Development was conducted as described in Example 1 with the exception of the warm soak step being modified to 120 seconds at 80° F. and a significant decrease from about 1 quart to less than 8 ounces of sawdust slurry needed to achieve development. Additionally, the sawdust slurry treatment had to be done very slowly to minimize the abrasion in order to retain the highlight details.

The finished print provided a full tonal range image though the middle and shadow tones were rendered darker than in Example 1.

EXAMPLE 5

In this example, the gum arabic content in the top pigmented (second) coating formulation (c) was maximized while maintaining the same total dry weight gum arabic and gelatin content as compared to Example 1. The ratio of gum arabic to gelatin in the top pigmented coating is approximately 3:1.

a) Size Coating Formulation

Identical to Example 1.

b) Intermediate Coating Formulation

Identical to Example 1.

c) Top Pigmented Coating Formulation 76 ml. Distilled Water
5.3 gm. Gelatin (soft food grade gelatin)
7.5 gm. Glycerin Soap (shavings)
1.25 ml. Corn Syrup
55 ml. 14 Baume Gum Arabic
7.5 ml. 4% Ammonium Hydroxide Solution
102 ml. 70% Isopropyl Alcohol
10 gm. Pigment, Carbon Black
6.25 gm. Ammonium Dichromate The formula preparation and application procedures were identical to Example 1 with the exception of utilizing the top pigmented coating (c) formula shown above.

A 4"×5" enlargement was made with an exposure of 14 minutes utilizing the procedures in Example 1.

Development was conducted as described in Example 1 with the exception of the warm soak step being modified to 30 seconds at 82° F. and a decrease from about 1 quart to about 1 pint of sawdust slurry needed to achieve development.

The finished print provided a full tonal range image though the highlight tones were shifted darker and the shadow tones were shifted lighter than in Example 1. In general, the overall tonal range of the print was reduced as compared to Example 1.

EXAMPLE 6

In this example, the formulations of Example 1 are utilized except that the ammonium dichromate light sensitizing agent is not incorporated into the top pigmented (second) coating layer at the time of the paper's preparation. Rather, sensitizing was accomplished at a later time by immersing the paper in a solution of ammonium dichromate.

a) Size Coating Formulation

Identical to Example 1.

b) Intermediate Coating Formulation

Identical to Example 1.

c) Top Pigmented Coating Formulation 94 ml. Distilled Water
10.6 gm. Gelatin (soft food grade gelatin)
7.5 gm. Glycerin Soap (shavings)
1.25 ml. Corn Syrup
37 ml. 14 Baume Gum Arabic
7.5 ml. 4% Ammonium Hydroxide Solution
102 ml. 70% Isopropyl Alcohol
10 gm. Pigment, Carbon Black The formula preparation and application procedures were identical to Example 1 with the exception of utilizing the top pigmented coating (c) formula shown above. This formula deviates from Example 1 in that the ammonium dichromate was deleted.

The prepared direct pigment printing material was soaked in a 2% bath of ammonium dichromate for 2 minutes and hung up to air dry. Thereafter, a 4"×5" enlargement was made with an exposure of 7 minutes utilizing the procedures in Example 1.

Development was conducted as described in Example 1 with the exception of the warm soak step being modified to 60 seconds at 88° F. and an increase from about 1 quart to about 1 gallon of sawdust slurry needed to achieve development.

The finished print provided a full tonal range image with a slight decrease in overall intensity as compared to prints from Example 1.

EXAMPLE 7

In this example, the substrate was changed to a sheet of plexiglass plastic as compared to the use of paper in Example 1. The use of this non-porous substrate permitted the elimination of the size coating (a) from Example 1.

a) Not applicable b) Intermediate Coating Formulation: Identical to Example 1. The formula preparation procedures were identical to those used in Example 1.

c) Top Pigmented Coating Formulation. The formula and preparation procedures were identical to those set forth in Example 1.

Intermediate Coat Application:

A 4.5"×6.75" sheet of 1/16" thick plexiglass plastic was prepared to accept the direct pigment printing formulations. To effectively bond the formulations to the plastic, one side of the plastic sheet was wet sanded with 400 grit wet sandpaper, rinsed and dried.

The intermediate coating formulation (b) was heated to 130° F. +/−10° F. and held until the mixture was completely reversed to a liquid from its gelled condition at room temperature. The intermediate coating formulation (b) was then transferred into a detail spray gun equipped with a high viscosity needle assembly. The spray gun's paint cup was preheated at 130° F. +/−10° F. and maintained at this temperature in between coating layer applications.

Four layers of intermediate coating formulation (b) were sprayed onto the sanded surface side of the plastic substrate. Each layer constitutes a continuous spray application until the surface of the substrate appears wet but not so much so as to permit runs to begin to form. Should any runs or unevenness in coating application develop, the substrate can be placed faced up and level inside of a box maintained at 130° F. +/−10° F. for one to three minutes which permits the coating to flow and form a more even coating. Each coating layer application was permitted to air dry before applying the next coating layer.

The subsequent top pigment coat application steps were performed identically to Example 1.

A 4.5"×6" enlargement was made with an exposure of minutes utilizing the procedures in Example 1. The 7 subsequent development steps were performed identically to Example 1.

The finished print provided a full tonal range image of comparable tonal range to prints from Example 1. The extreme flatness of the substrate and its translucent qualities tended to magnify flaws inherent to the material's manual preparation. However, these same qualities provided a rather distinctive and unusual appearance.

EXAMPLE 8

In this example, the type of gelatin was changed to a hard photographic grade as compared to the soft food grade used in Example 1.

a) Size Coating Formulation 350 ml. Distilled Water
28 gm. Gelatin (hard photographic grade gelatin)
120 ml. 70% Isopropyl Alcohol b) Intermediate Coating Formulation 279 ml. Distilled Water
14 gm. Gelatin (hard photographic grade gelatin)
68 ml. 14 Baume Gum Arabic
120 ml. 70% Isopropyl Alcohol
9.3 gm. $TiO_2$ White Pigment (Optional)

c) Top Pigmented Coating Formulation 94 ml. Distilled Water
10.6 gm. Gelatin (hard photographic grade gelatin)
7.5 gm. Glycerin Soap (shavings)
1.25 ml. Corn Syrup
37 ml. 14 Baume Gum Arabic
7.5 ml. 4% Ammonium Hydroxide Solution
102 ml. 70% Isopropyl Alcohol
10 gm. Pigment, Carbon Black
6.25 Ammonium Dichromate The formula preparation and application procedures were identical to Example 1 with the exception of utilizing the size coating (a), intermediate coating (b) and top pigmented coating (c) formulations shown above.

A 4:×5" enlargement was made with an exposure of 7 minutes utilizing the procedures in Example 1.

Development was conducted as described in Example 1. A slight increase in the effectiveness of the sawdust slurry treatment was observed.

The finished print provided a full tonal range image of comparable tonal range and quality to prints from Example 1.

EXAMPLE 9

In this example, the type of gum arabic was changed to a synthetic gum arabic substitute as compared to the natural gum arabic used in Example 1. The proprietary synthetic gum is manufactured in Germany by Hanns Eggen-Sarstedt and sold under the trade name EGGEN Agum 0.

a) Size Coating Formulation

Identical to Example 1.

b) Intermediate Coating Formulation 279 ml. Distilled Water 14 gm. Gelatin (soft food grade gelatin)
68 ml. synthetic gum arabic
120 ml. 70% Isopropyl Alcohol
9.3 gm. TiO$_2$ White Pigment (Optional)

c) Top Pigmented Coating Formulation 94 ml. Distilled Water
10.6 gm. Gelatin (soft food grade gelatin)
7.5 gm. Glycerin soap (shavings)
1.25 ml. Corn Syrup
37 ml. synthetic gum arabic
7.5 ml. 4% Ammonium Hydroxide Solution
102 ml. 70% Isopropyl Alcohol
10 gm. Pigment, Carbon Black
6.25 gm. Ammonium Dichromate The formula preparation and application procedures were identical to Example 1 with the exception of utilizing the intermediate coating (b) and top pigmented coating (c) formulations shown above.

A 4"×5" enlargement was made with an exposure of 7 minutes utilizing the procedures in Example 1.

Development was conducted as described in Example 1.

The finished print provided a full tonal range image of comparable tonal range and quality to prints from Example 1.

EXAMPLE 10

In this example, the method of application was changed to a simple pouring operation as compared to spraying utilized in Example 1.

a) Size Coating Formulation 360 ml. Distilled water
28 gm. Gelatin (soft food grade gelatin)
26 ml. 70% Isopropyl Alcohol
3.9 ml. 4% Ammonium Hydroxide Solution b) Intermediate Coating Formulation 314 ml. Distilled Water
28 gm. Gelatin (soft food grade gelatin)
46 ml. 14 Baume Gum Arabic
26 ml. 70% Isopropyl Alcohol c) Top Pigmented Coating Formulation 146 ml. Distilled Water
25.0 gm. Gelatin (soft food grade gelatin)
104 ml. 14 Baume Gum Arabic
250 ml. 70% Isopropyl Alcohol
25 gm. Pigment, Carbon Black The formula preparation procedures were identical to those used in Example 1.

Size Coat Application:

The size coating formulation (a) was heated to 130° F. +/−10° F. and held until the mixture was completely reversed to a liquid from its gelled condition at room temperature. A 11.5"×14.5" sheet of Rives BFK paper was wet and squeegeed to a 11"×14" glass plate. The paper, squeegeed to the glass, and size mixture were placed inside of a hot box maintained at 130° F. +/−10° F. The glass plate was leveled and the size flowed onto the surface of the paper through a tube attached to a funnel to minimize entrained air bubbles. A glass rod was used to assist the flow of the size coating and to remove any air bubbles from the surface of the paper. The coated paper was removed from the hot box and kept level until the size was gelled and then the paper was removed from the glass plate and hung to dry. After the drying, the procedure was repeated once for a total of two coats.

Intermediate Coat Application (first coating): The intermediate coating formulation (b) was heated to 130° F. +/−10° F. and held until the mixture was completely reversed to a liquid from its gelled condition at room temperature. The sheet of paper containing coating (a) was wet and squeegeed to a glass plate. The paper, squeegeed to the glass, and intermediate coating mixture were placed inside of a hot box maintained at 130° F. +/−10° F. The glass plate was leveled and the intermediate formulation flowed onto the surface of the paper through a tube attached to a funnel to minimize entrained air bubbles. A glass rod was used to assist the flow of the intermediate coating and to remove any air bubbles from the surface of the paper. The coated paper was removed from the hot box and kept level until the intermediate coating was gelled and then the paper was removed from the glass plate and hung to dry.

Top Pigment Coat Application (second coating): The top pigment coating formulation (c) was heated to 130° F. +/−10° F. and held until the mixture was completely reversed to a liquid from its gelled condition at room temperature. A 5% by weight aqueous solution of ammonium dichromate was prepared and heated to 130° F. +/−10° F. which was then mixed on a 1:1 volume basis with the top pigmented coating formulation (c). This mixture was then transferred into an air brush equipped with a high viscosity needle assembly. The air brush's paint jar was preheated to 130° F. +/−10° F.

One layer of top pigment coating formulation (c) and 5% ammonium dichromate solution mixture was sprayed onto the surface of the coated paper substrate containing coatings (a) and (b). The spray application was done by mist coating the paper substrate with several passes to provide a fairly heavy coating but not so heavy as to create a solid colored finish. When using carbon black as the pigment, the coated paper appears dark gray to black under reflected light and gray when viewed by light transmitted through a paper substrate. The top pigment coating layer was permitted to air dry which completed the preparation of the Direct Pigment Photographic Printing Paper.

An 11"×14" enlargement was made with an exposure of 18 minutes utilizing the procedures in Example 1.

Development was conducted as described in Example 1 with the exception of the warm soak step being modified to 60 seconds at 87° F.

The finished print provided a full tonal range image of comparable tonal range and quality to prints from Example 1.

The foregoing examples illustrate the advantages of this invention but are not intended to be limiting, except as defined by the appended claims.

I claim:

1. A direct pigment photographic print paper having a photographic printing composition applied to sealed paper, the printing composition comprising:
   a multi-layer coating composition comprising a first layer coating and a second layer coating applied as a first coating and a second coating respectively to the sealed paper substrate, where the multi-layer coating composition contains pigment in the first coating and/or the second coating;
   the first coating comprising a homogeneous aqueous mixture of gum arabic and gelatin containing between 20% and 80% by weight gum arabic, where the first coating is applied to the sealed paper substrate as a homogeneous aqueous mixture at temperatures above about 105° F. and dried to provide a coated substrate;
   the second coating comprising a homogeneous aqueous mixture of gum arabic and gelatin containing between 15% and 75% by weight gum arabic, where the second coating is applied to the coated substrate as a homogeneous mixture at a temperature above about 105° F. and dried to provide a direct pigment photographic printing papers;
   and optionally a dichromate compound or light sensitive dye as a light sensitizing agent.

2. The direct pigment photographic printing paper of claim 1 where the first coating contains between 40% and 70% by weight gum arabic based on the gum arabic and gelatin mixture and the second coating contains pigment.

3. The direct pigment photographic printing paper of claim 1 where the second coating contains pigment.

4. The direct pigment photographic printing paper of claim 2 where the second coating contains pigment and between 15% and 50% by weight gum arabic based on the gum arabic and gelatin mixture.

5. The direct pigment photographic printing paper of claim 1 where the first coating contains between 40% and 70% by weight gum arabic based on the gum arabic and gelatin mixture, and the second coating contains pigment and between 15% and 50% by weight gum arabic based on the gum arabic and gelatin mixture.

6. The direct pigment printing paper of claim 1 containing the light sensitizing agent and exposed to actinic light through a continuous tone negative or positive transparency and developed by one or more immersions in water and mildly abraded to remove unexposed areas to produce a continuous tone direct pigment photographic print.

7. A process for producing direct pigment photographic print paper, the process steps comprising:
   providing a sized paper substrate;
   forming a homogeneous first coating comprising an aqueous mixture of gum arabic and gelatin containing by weight between 20% and 80% gum arabic, where the first coating is sufficiently heated above about 105° F. to form the homogeneous aqueous solution;
   applying the first coating at temperatures above about 105° F. to the sized paper substrate to form a coated substrate;
   forming a homogeneous second coating comprising an aqueous mixture of gum arabic and gelatin containing by weight between about 15% and 75% by weight gum arabic;
   applying the second coating at temperatures above about 105° F. to the coated substrate to produce a direct pigment photographic print paper;
   and optionally providing a dichromate compound or light sensitive dye as a light sensitizing agent.

8. The process of claim 7 where the second coating contains pigment.

9. The process in claim 7 where the first coating contains between 40% and 70% by weight gum arabic based on the gum arabic and gelatin mixture.

10. The process of claim 7 where the second coating contains pigment and between 15% and 50% by weight gum arabic based on the gum arabic and gelatin mixture.

11. The process of claim 7 where the first coating contains between 40% and 70% by weight gum arabic based on the gum arabic and gelatin mixture, and the second coating contains pigment and between 15% and 50% by weight gum arabic based on the gum arabic and gelatin mixture.

12. The process of claim 7 where the first coating is heated between 120° F. to 140° F. to form the homogeneous solution when applied to the sized paper substrate.

13. The process of claim 7 where the second coating is heated between 120° F. to 140° F. to form the homogeneous solution when applied to the coated substrate.

14. The process of claim 7 where the first and second coatings are each applied as a coating layer to the paper substrate as a homogeneous solution heated between 120° F. to 140° F., and at least one of the coating layers contain pigment.

15. The process of claim 7 where the coating on the direct pigment photographic print paper contains the light sensitizing agent and the coated paper is exposed to actinic light through a continuous tone negative, where the exposed coated paper is developed by one or more immersions in water and mildly abraded to remove unexposed areas to produce a continuous tone direct photographic positive print.

16. A process for producing direct photographic print on a coated substrate, the process steps comprising:
   providing a sealed substrate;
   forming a first coating composition comprising a homogeneous aqueous mixture of gum arabic and gelatin containing by weight between about 20% and 80% gum arabic by heating the aqueous gum arabic and gelatin mixture to a temperature above about 105° F. to form the homogeneous aqueous mixture;
   applying the first coating heated above about 105° F. to the sealed substrate to form a first coated surface on the substrate;
   forming a second coating composition comprising a homogeneous aqueous mixture of gum arabic and gelatin containing by weight between 15% and 75% gum arabic by heating the aqueous gum and gelatin mixture to a temperature above about 105° F. to form a homogeneous aqueous mixture;
   applying the second coating at temperatures above about 105° F. to the first coated surface to produce a direct pigment photographic substrate;
   providing a dichromate compound or light sensitive dye as a light sensitizing agent and exposing to actinic light.

17. The process of claim 16 where the coated substrate contains is exposed to actinic light through a continuous tone negative or positive transparency, where the exposed coated substrate is developed by one or more immersions in water and mildly abraded to remove unexposed areas to produce a continuous tone direct photographic positive print on the substrate.

* * * * *